United States Patent [19]
Elkind et al.

[11] Patent Number: 5,416,030
[45] Date of Patent: May 16, 1995

[54] METHOD OF REDUCING LEAKAGE CURRENT IN AN INTEGRATED CIRCUIT

[75] Inventors: Jerome L. Elkind; Lissa K. Magel, both of Dallas, Tex.

[73] Assignee: Texas Instruments Incorporated, Dallas, Tex.

[21] Appl. No.: 136,501

[22] Filed: Oct. 14, 1993

Related U.S. Application Data

[63] Continuation of Ser. No. 881,110, May 11, 1993, abandoned.

[51] Int. Cl.⁶ ............................................. H01L 31/18
[52] U.S. Cl. .......................................... 437/5; 437/22; 437/234; 437/905; 148/DIG. 64; 148/DIG. 135
[58] Field of Search ................. 437/5, 2, 3, 4, 22, 437/23, 234, 974; 148/DIG. 64, DIG. 165, DIG. 167, DIG. 157, DIG. 32-34, DIG. 135

[56] References Cited

U.S. PATENT DOCUMENTS

| | | | |
|---|---|---|---|
| 3,684,901 | 8/1972 | Kroger | 437/904 |
| 3,799,803 | 3/1974 | Kraus et al. | 148/DIG. 64 |
| 4,141,756 | 2/1979 | Chiang et al. | 148/DIG. 84 |
| 4,206,003 | 6/1980 | Koehler et al. | 437/3 |
| 4,206,470 | 6/1980 | White | |
| 4,376,663 | 3/1983 | Wang et al. | 437/3 |
| 4,452,644 | 6/1984 | Bruel et al. | 437/160 |
| 4,625,389 | 12/1986 | Readhead | 437/3 |
| 4,766,084 | 8/1988 | Bory et al. | 437/3 |
| 4,927,773 | 5/1990 | Jack et al. | 437/987 |
| 5,017,511 | 5/1991 | Elkind et al. | 437/234 |
| 5,156,980 | 10/1992 | Hisa | 148/DIG. 64 |

FOREIGN PATENT DOCUMENTS

| | | | |
|---|---|---|---|
| 59-229838 | 12/1984 | Japan | 148/DIG. 157 |
| 60-175416 | 9/1985 | Japan | 148/DIG. 83 |
| 60-177621 | 9/1985 | Japan | 148/DIG. 83 |
| 60-251632 | 12/1985 | Japan | |
| 61-251131 | 11/1986 | Japan | |

OTHER PUBLICATIONS

Cotton et al., Effects of ion implantation on deep electron traps in $Hg_{0.7}Cd_{0.3}Te$; J. Vac. Sci Tech., 4(4); Jul. 8, 1986.

Marine et al., P-N junction formation in ion-implanted ZnTe; Applied Phys. Letters; 17(8); Oct. 1970.

*Primary Examiner*—Brian Hearn
*Assistant Examiner*—Michael Trinh
*Attorney, Agent, or Firm*—Brian A. Carlson; James C. Kesterson; Richard L. Donaldson

[57] ABSTRACT

A method is provided for reducing leakage current in an integrated circuit (24). A first doped region (18) having a first conductivity type is formed in a semiconductor layer (10) having a second conductivity type, such that a second doped region (20) having the first conductivity type is formed in the semiconductor layer (10). The second doped region (20) is less conductive than the first doped region (18). The first doped region (18) is removed from the semiconductor layer (10), such that the second doped region (20) substantially remains in the semiconductor layer (10). The integrated circuit (24) is formed to include the second doped region (20) and the semiconductor layer (10).

17 Claims, 1 Drawing Sheet

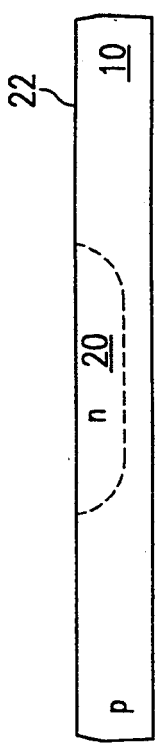
FIG. 2c
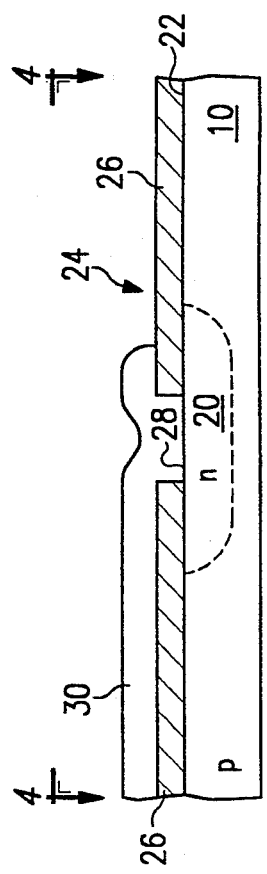
FIG. 3
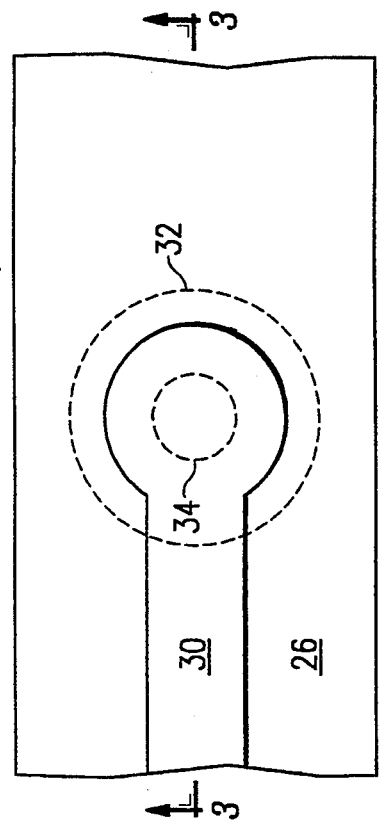
FIG. 4
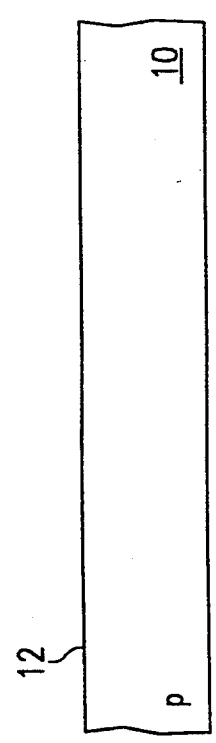
FIG. 1
FIG. 2a
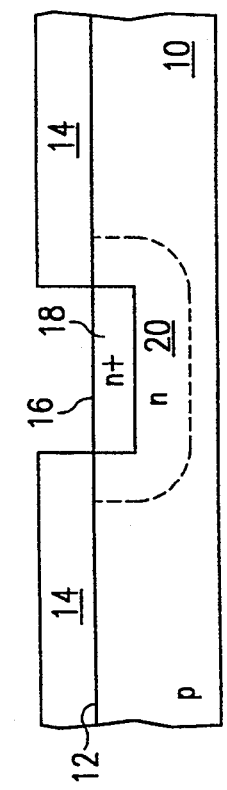
FIG. 2b

METHOD OF REDUCING LEAKAGE CURRENT IN AN INTEGRATED CIRCUIT

This is a continuation of application Ser. No. 07/881,110, filed May 11, 1992, now abandoned.

TECHNICAL FIELD OF THE INVENTION

This patent application relates in general to integrated circuits and in particular to a method of reducing leakage current in an integrated circuit.

BACKGROUND OF THE INVENTION

In a typical HgCdTe n/p photodiode, a heavily doped n+ type region is implanted in an upper surface of a vacancy doped p type HgCdTe semiconductor layer. Type conversion occurs by electrically active radiation damage, and by the liberation of mercury from the disrupted lattice and its subsequent diffusion to fill acceptor vacancies. Accordingly, any ionic specie may be used. The implanted n+ type region has a very high n type carrier concentration and extends only a few thousand Angstroms below the upper surface. Nevertheless, a diffused n type region extends much further into the HgCdTe semiconductor layer, resulting from the liberated and diffused mercury. In addition to implanting the n+ type region in this manner, an insulator layer is formed over the upper surface.

By design, the active junction is between the diffused n type region and the p type HgCdTe. However, the active junction can be very different near the upper surface. If the insulator layer has a high level of negative fixed charge, or if a negative guard ring bias is used, then the n type region near the upper surface becomes inverted to a p+ type region. The p+ type region abuts the implanted n+ type region, such that tunnel leakage current ("leakage current") is undesirably increased between the p+ type region and the implanted n+ type region. Such leakage current has been linked to 1/f noise. Accordingly, signal-to-noise performance of the photodiode is degraded, such that the photodiode is less effective at indicating an amount of radiation incident on the photodiode. In many cases, the active junction moves from the mildly graded n/p junction to the sharply graded n+/p+ junction. This phenomenon is referred to as "pinch-off".

A first previous technique attempts to reduce such leakage current by precisely establishing the fixed charge of the insulator layer. Under this first approach, the passivation requirements of nearly zero fixed charge and bake stability are very stringent. As a practical matter, it is very difficult to precisely establish the fixed charge of the insulator, and a deviation in fixed positive or negative charge can increase leakage current.

A second previous technique attempts to reduce leakage current by using a metal guard ring to set the potential at the upper surface. As a practical matter, it is very difficult to precisely set the surface potential of such a metal guard ring, and noise variations in the surface potential can increase leakage current. Undesirably, fabrication complexity increases and yield decreases, due to the additional required step of carefully forming the metal guard ring which is subject to being inadvertently shorted to other elements of the integrated circuit.

Thus, a need has arisen for a method of reducing leakage current in an integrated circuit, in which leakage current is reduced more effectively than in previous techniques. A need has also arisen for a method of reducing leakage current in an integrated circuit, in which passivation requirements are less stringent than in previous techniques. Further, a need has arisen for a method of reducing leakage current in an integrated circuit, in which fabrication is less complex than in previous techniques. Moreover, a need has arisen for a method of reducing leakage current in an integrated circuit, in which yield is higher than in previous techniques.

SUMMARY OF THE INVENTION

In a method of reducing leakage current in an integrated circuit, a first doped region having a first conductivity type is formed in a semiconductor layer having a second conductivity type, such that a second doped region having the first conductivity type is formed in the semiconductor layer. The second doped region is less conductive than the first doped region. The first doped region is removed from the semiconductor layer, such that the second doped region substantially remains in the semiconductor layer. The integrated circuit is formed to include the second doped region and the semiconductor layer.

It is a technical advantage of the present invention that leakage current is reduced more effectively than in previous techniques.

It is another technical advantage of the present invention that passivation requirements are less stringent than in previous techniques.

It is a further technical advantage of the present invention that fabrication is less complex than in previous techniques.

It is yet another technical advantage of the present invention that yield is higher than in previous techniques.

BRIEF DESCRIPTION OF THE DRAWINGS

For a more complete understanding of the present invention, and the advantages thereof, reference is now made to the following descriptions taken in conjunction with the accompanying drawings, in which:

FIG. 1 is a cross-sectional view of a vacancy doped p type HgCdTe epitaxial semiconductor layer for fabricating a diode according to the preferred embodiment;

FIGS. 2a–c are sequential cross-sectional views of the semiconductor layer of FIG. 1 after performing respective processing steps for fabricating a diode according to the preferred embodiment;

FIG. 3 is a cross-sectional view of the diode fabricated according to the preferred embodiment; and FIG. 4 is a top plan view of the diode of FIG. 3.

DETAILED DESCRIPTION OF THE INVENTION

The preferred embodiment of the present invention and its advantages are best understood by referring to FIGS. 1 through 4 of the drawings, like numerals being used for like and corresponding parts of the various drawings.

FIG. 1 is a cross-sectional view of a vacancy doped p type HgCdTe epitaxial semiconductor layer 10 for fabricating a diode according to the preferred embodiment. Semiconductor layer 10 is grown at a thickness of approximately 10 micrometers over a CdTe substrate (not shown). Semiconductor layer 10 includes an upper surface 12 and has Hg vacancies on the order of $10^{16}/cm^3$.

FIGS. 2a–c are sequential cross-sectional views of semiconductor layer 10 of FIG. 1 after performing respective processing steps for fabricating a diode according to the preferred embodiment. Referring to FIG. 2a, a photoresist layer 14 is patterned on upper surface 12. An exposed portion 16 of upper surface 12 remains uncovered by photoresist layer 14. Exposed portion 16 has a lateral span across upper surface 12 of approximately 25 micrometers. Photoresist layer 14 has a thickness of approximately 3.5 micrometers. After patterning photoresist layer 14, a heavily doped n+ type region 18 is implanted through exposed portion 16 by electrically active radiation damage from a beam of boron (B+) ions at an energy of approximately 100 keV. However, any ionic specie may be used, such as mercury (Hg+) ions.

The n+ type region 18 has a thickness of approximately 2000 Angstroms and has negative charge carriers on the order of $10^{18}/cm^3$. The n+ type region 18 is implanted such that a diffused n type region 20 is formed resulting from liberated and diffused mercury. Relative to n+ type region 18, n type region 20 extends much further laterally and vertically into the semiconductor layer. The n type region 20 has a maximum vertical depth greater than 1 micrometer and has a lateral span across upper surface 12 of approximately 25 micrometers. The n type region 20 has negative charge carriers on the order of $10^{14}/cm^3$. Accordingly, n type region 20 is less conductive than n+ type region 18.

By design, the active junction is between n type region 20 and p type semiconductor layer 10. However, if n type region 20 near upper surface 12 is inverted to a p+ type region (not shown), then such a p+ type region would abut n+ type region 18, thereby increasing leakage current between the p+ type region and n+ type region 18. It is desirable to substantially eliminate such leakage current.

After implanting n+ type region 18 and forming n type region 20, photoresist layer 14 is stripped as shown in FIG. 2b. In a significant aspect of the preferred embodiment, n+ type region 18 is then removed from semiconductor layer 10 by light wet isotropic etching of a depth D (FIG. 2b), such that n type region 20 substantially remains in semiconductor layer 10 after the light wet isotropic etching. The light wet isotropic etch is performed using a suitable wet etchant, such as $Br_2/CH_3OH$. The depth D can be from 2000 to 5000 Angstroms, such that n type region 20 continues having a maximum vertical depth greater than 1 micrometer for fabricating an integrated circuit device.

FIG. 2c shows semiconductor layer 10 and n type region 20 after the wet etching. As shown in FIG. 2c, semiconductor layer 10 and n type region 20 have an upper surface 22. Advantageously, leakage current from surface tunneling is substantially eliminated because n+ type region 18 is removed.

After removing n+ type region 18, an integrated circuit is formed to include n type region 20 and semiconductor layer 10. For example, the integrated circuit can be a HgCdTe n/p photodiode. FIG. 3 is a cross-sectional view of a HgCdTe n/p photodiode 24 according to the preferred embodiment. Diode 24 is formed after the wet etching described hereinabove in connection with FIGS. 2b–c.

In forming diode 24, an insulator layer 26 is grown at a thickness of approximately 4000 Angstroms over all regions of upper surface 22. In the preferred embodiment, insulator layer 26 is formed of zinc sulfide, although any suitable insulator such as CdTe can be used. After growing insulator layer 26, a photoresist layer (not shown) is patterned on insulator layer 26 to define a region of insulator layer 26 to be etched. Then, the defined region of insulator layer 26 is etched to create an exposed hole region 28 of upper surface 22. Hole region 28 has a lateral span across upper surface 22 of approximately six micrometers. After creating hole region 28, the photoresist layer is stripped.

After creating hole region 28 and stripping the photoresist layer, another photoresist layer (not shown) is patterned on insulator layer 26 to define a region of insulator layer 26 over which to deposit metal. Then, a metal contact 30 is deposited at a thickness of approximately 200 Angstroms over the defined region of insulator layer 26, such that metal contact 30 is deposited in hole region 28 to contact n type region 20 through insulator layer 26 as shown in FIG. 3. In the preferred embodiment, metal contact 30 is formed of nickel, although any suitable metal such as gold can be used. After depositing metal contact 30, the photoresist layer is stripped.

In operation, a current flows between semiconductor layer 10 and metal contact 30 to indicate a photon flux of radiation incident on diode 24. Since there is not an n+ region in close proximity to a p+ region, diode 24 advantageously withstands elevated levels of fixed negative charge in insulator layer 26 without significant leakage current. Accordingly, surface passivation requirements of diode 24 are advantageously relaxed.

FIG. 4 is a top plan view of diode 24 from the perspective indicated in FIG. 3. Dashed phantom enclosure 32 indicates the area of n type region 20. Dashed phantom enclosure 34 indicates the area of hole region 28 (FIG. 3), which is filled by metal contact 30 to contact n type region 20. In the preferred embodiment, a layer of indium (not shown) is deposited over metal contact 30 at a thickness of approximately 10,000 Angstroms.

Although the present invention and its advantages have been described in detail, it should be understood that various changes, substitutions and alterations can be made herein without departing from the spirit and scope of the invention as defined by the appended claims.

What is claimed is:

1. A method of reducing leakage current in an integrated circuit, said method comprising the steps of:
   implanting ions in a mercury cadmium telluride epitaxial semiconductor layer having a p conductivity type, said ions forming a doped region having an n+ conductivity type in said semiconductor layer, said implanting causing liberation and diffusion of a portion of said mercury from said doped region, said diffusion of said portion of said mercury forming a diffused region having an n conductivity type adjacent said doped region, said diffused region being less conductive than said doped region;
   removing said doped region having said n+ conductivity type from said semiconductor layer by isotropically etching said semiconductor layer, such that said diffused region having said n conductivity type substantially remains in said semiconductor layer; and
   forming said integrated circuit to include said diffused region and said semiconductor layer.

2. The method of claim 1 wherein said step of removing comprises the step of light wet isotropic etching said semiconductor layer using a wet etchant.

3. The method of claim 2 wherein said step of light wet isotropic etching comprises the step of light wet isotropic etching said semiconductor layer using $Br_2/CH_3OH$.

4. The method of claim 1 wherein said step of forming said integrated circuit comprises forming a diode.

5. The method of claim 1 wherein said portion of said mercury fills acceptor vacancies in said diffused region.

6. The method of claim 1 wherein said ions comprise boron ions.

7. The method of claim 1, wherein said step of removing comprises the step of isotropically etching said semiconductor layer to a depth of at least 2000 Angstroms.

8. The method of claim 7, wherein said step of removing comprises the step of isotropically etching said semiconductor layer to a depth of between 2000 Angstroms and 5000 Angstroms.

9. The method of claim 1 wherein said step of isotropically etching comprises the step of etching said semiconductor layer such that said diffused region has a maximum vertical depth of at least 1 micrometer.

10. The method of claim 1, wherein said semiconductor layer having a p conductivity type comprises mercury vacancies on the order of $10^6/cm^3$.

11. The method of claim 1, wherein said doped region having an n+ conductivity type comprises negative charge carriers on the order of $10^{18}/cm^3$.

12. The method of claim 1, wherein said diffused region having an n conductivity type comprises negative charge carriers on the order of $10^{14}/cm^3$.

13. The method of claim 1 wherein said semiconductor layer is formed on a CdTe substrate.

14. The method of claim 4 wherein said step of forming said diode comprises the step of forming a photodiode.

15. The method of claim 14 wherein said stop of forming said photodiode comprises the step of forming a HgCdTe n/p photodiode.

16. The method of claim 1 wherein said step of forming said integrated circuit comprises the step of growing an insulator layer over said semiconductor layer.

17. The method of claim 16 wherein said step of forming said integrated circuit comprises the stop of contacting said diffused region through said insulator layer with a metal contact.

* * * * *